United States Patent
Hellings et al.

(10) Patent No.: US 9,159,860 B2
(45) Date of Patent: Oct. 13, 2015

(54) AVALANCHE PHOTODETECTOR ELEMENT

(71) Applicant: IMEC, Leuven (BE)

(72) Inventors: Geert Hellings, Heverlee (BE); Joris Van Campenhout, Brussels (BE); Peter Verheyen, Nijlen (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/087,983

(22) Filed: Nov. 22, 2013

(65) Prior Publication Data

US 2014/0138787 A1    May 22, 2014

(30) Foreign Application Priority Data

Nov. 22, 2012 (EP) .................................. 12193767

(51) Int. Cl.
| | |
|---|---|
| H01L 31/0232 | (2014.01) |
| H01L 31/107 | (2006.01) |
| H01L 31/0224 | (2006.01) |
| H01L 31/028 | (2006.01) |
| H01L 31/0352 | (2006.01) |

(52) U.S. Cl.
CPC ............ *H01L 31/107* (2013.01); *H01L 31/028* (2013.01); *H01L 31/022408* (2013.01); *H01L 31/03529* (2013.01); *Y02E 10/547* (2013.01)

(58) Field of Classification Search
CPC .. H01L 31/107; H01L 31/02327; H01L 21/84
USPC ..................... 257/81, 25, 432, 438–439, 458, 257/E31.052; 385/14, 86, 89, 92
See application file for complete search history.

(56) References Cited

U.S. PATENT DOCUMENTS

| | | | |
|---|---|---|---|
| 7,082,248 B1 * | 7/2006 | Morse ........................... | 385/131 |
| 7,397,101 B1 * | 7/2008 | Masini et al. .................. | 257/458 |
| 2008/0193076 A1 | 8/2008 | Witzens et al. | |

(Continued)

FOREIGN PATENT DOCUMENTS

EP    1833095 A1    9/2007

OTHER PUBLICATIONS

Assefa, Solomon, et al., "Reinventing germanium avalanche photodetector for nanophotonic on-chip optical interconnects," Macmillian Publisher Limited, Mar. 4, 2010, vol. 464 pp. 80-85.

(Continued)

*Primary Examiner* — Dung Le
(74) *Attorney, Agent, or Firm* — McDonnell Boehnen Hulbert & Berghoff LLP

(57) ABSTRACT

An avalanche photodetector element is disclosed for converting an optical signal to an electrical signal, comprising an input waveguide and a photodetector region, the photodetector region comprising at least one intrinsic region, at least one p-doped region and at least one n-doped region, the doped regions and the at least one intrinsic region forming at least one PIN-junction avalanche photodiode, the input waveguide and the photodetector region being arranged with respect to each other such that the optical signal conducted by the input waveguide is substantially conducted into the photodetector region to the PIN-junction avalanche photodiode, the PIN-junction avalanche photodiode converting the optical signal to an electrical signal, characterized in that the photodetector region comprises more than one p-doped region and/or n-doped region, whereby these p-doped regions and/or n-doped regions are physically arranged as an array.

9 Claims, 7 Drawing Sheets

(56) References Cited

U.S. PATENT DOCUMENTS

| | | |
|---|---|---|
| 2009/0022500 A1* | 1/2009 | Pinguet et al. .............. 398/164 |
| 2010/0282948 A1 | 11/2010 | Miyajima et al. |
| 2011/0024608 A1 | 2/2011 | Assefa et al. |

OTHER PUBLICATIONS

European Search Report, European Patent Application No. 12193767.6, dated May 6, 2013.

Assefa, Solomon et al., "CMOS-Integrated 40 GHz Germanium Waveguide Photodetector for On-Chip Optical Interconnects", Optical Fiber Communication Conference, Mar. 22-26, 2009, San Diego, California, 3 pages.

Assefa, Solomon et al., "CMOS-Integrated Optical Receivers for On-Chip Interconnects", IEEE Journal of Selected Topics in Quantum Electronics, vol. 16, No. 5, Sep./Oct. 2010, pp. 1376-1385.

Li, Guoliang et al., "Improving CMOS-Compatible Germanium Photodetectors", Optics Express, vol. 20, No. 24, Nov. 19, 2012, pp. 26345-26350.

Assefa, Solomon et al., "Reinventing Germanium Avalanche Photodetector for Nanophotonic On-Chip Optical Interconnects", Nature, vol. 464, Mar. 2010, pp. 80-85.

Assefa, Solomon et al., "CMOS-Integrated High-Speed MSM Germanium Waveguide Photodetector", Optics Express, vol. 18, No. 5, Mar. 1, 2010, pp. 4986-4999.

Masini, Gianlorenzo et al., "A 1550nm, 10Gbps Monolithic Optical Receiver in 130nm CMOS with Integrated Ge Waveguide Photodector", 2007 4th IEEE International Conference on Group IV Photonics, Sep. 19-21, 2007, pp. 28-30.

Oh, Jungwoo et al., "Interdigitated Ge p-i-n Photodetectors Fabricated on a Si Substrate Using Graded SiGe Buffer Layers", IEEE Journal of Quantum Electronics, vol. 38, No. 9, Sep. 2002, pp. 1238-1241.

\* cited by examiner

AVALANCHE PHOTODETECTOR ELEMENT

RELATED APPLICATIONS

Pursuant to the provision of 35 U.S.C. §119(b), this application claims priority to European Application EP 12193767.6, which was filed on Nov. 22, 2012, the entire contents of which are incorporated herein by reference.

FIELD

The current disclosure relates to an avalanche photodetector for converting an optical signal to an electrical signal according.

The present disclosure also relates to use of such avalanche photodetector.

BACKGROUND

Infrared avalanche photodetectors are already known to the person skilled in the art. For example, the known avalanche photodetector element comprises an absorbing intrinsic semiconducting material with bandgap smaller than photon energy of the to-be-detected light wave, including Group IV semiconductors such as Germanium (Ge), Silicon-Germanium (SiGe), Germanium Tin (GeSn) or SiGeSn alloys, or alternatively, binary, ternary and quaternary III-V semiconductors, including but not limited to InP, InGaAs, InGaAsP and related materials.

Light with infrared wavelengths can be coupled directly from free space into the absorbing semiconductor, or alternatively, can be guided and coupled into the absorbing semiconductor by means of an optically transparent input waveguide, which can be built from optically transparent semiconductors such as silicon. The absorbing semiconducting material comprises a p-doped region, an n-doped region, and an intrinsic region in between the doped regions. A schematic overview of such configuration is for example shown in FIG. 1. The p-doped, the n-doped and the intrinsic region are implemented longitudinally along the propagation direction of the incoming light wave and extend with their longitudinal direction parallel to each other and parallel to the longitudinal direction of the absorbing material. The doped regions and the intrinsic semiconducting material thus form a PIN-junction photodiode wherein the input waveguide, if present, and the intrinsic semiconducting material are arranged with respect to each other such that optical waves, with typical infrared wavelengths greater than 1200 nm, guided by the input waveguide are substantially coupled into the intrinsic semiconducting material to the so called PIN-junction, formed by the combination of a p-doped region, an n-doped region and the intrinsic semiconducting material in between them, forming a PIN photodiode.

A reverse bias potential difference is applied between the p-doped region and the n-doped region, resulting in an electric field in the intrinsic region. At the intrinsic, absorbing region of the PIN-junction, the optical signal is converted to an electrical signal by optical excitation of electrons from the valence band to the conduction band under influence of the optical waves, essentially forming free electrons and free holes in the semiconducting material, which are subsequently collected at the n-doped region and p-doped region respectively, under the influence of the internal electric field.

For a sufficiently high electric field in the intrinsic region, the generated free electrons or the generated free holes, or both, can be multiplied by the mechanism known as impact ionization, essentially creating an avalanche of free electrons and/or holes. Such resulting multiplication gain essentially improves the responsiveness of the photodiode, potentially resulting in superior sensitivity of optical receivers built from such avalanche photodetectors. However, it has been found that for creating a sufficiently large multiplication gain of the free electrons and or holes, necessary for increased receiver sensitivity, a relatively strong electric field must be created in between the doped regions. Although the strength of the electric field can be increased by increasing the reverse bias potential difference over the doped regions, the increased potential difference requires for example more power leading to an increase in the power needed to use such avalanche photodetector element.

SUMMARY

An avalanche photodetector element is disclosed to increase the strength of an electric field coupled with the photodetector element without having to increase the bias potential difference of the photodetector element.

The avalanche photodetector element includes a photodetector region, which comprises more than one p-doped region and/or n-doped region, whereby these p-doped regions and/or n-doped regions are physically arranged as an array.

It has been found that when the photodetector region comprises more than one p-doped region and/or n-doped region, whereby these p-doped regions and/or n-doped regions are physically arranged as an array, on the same area as the avalanche photodetector element according to the state of the art, the dimensions of the different doped regions of the array are much smaller than the dimensions of the longitudinally shaped doped regions according to the state of the art. As the dimensions of the different doped regions are now smaller, the strength of the electric field will increase in the proximity of the doped regions without having to increase the reverse bias potential. Therefore, for example, the power required for operating the avalanche photodetector element does not need to be increased and can even be lowered with respect to the prior art avalanche photodetector element.

Moreover, it has been found that by decreasing the dimensions of the doped regions, the volume of material surrounding the doped regions which is susceptible to creation of optically excited electrons is increased.

Although in "Reinventing germanium avalanche photodetector for nanophotonic on-chip optical interconnects" by Solomon Assefa, Fengian Xia and Yurii A. Vlasov in Nature, Vol 464/4 March 2012 it is already discussed that strong non-uniform electric fields can be generated in avalanche photodetectors with relative small reverse bias potentials, the article relates to the use of avalanche photodetectors based on metal-semiconductor-metal Schottky detectors presenting, as described, high amplification noise characteristics and often a relatively large leakage current (dark current).

According to preferred embodiments of the current disclosure, the doped regions of the array of p-doped regions or n-doped regions are delimited from each other by at least one intrinsic region. The intrinsic region consists of undoped or intrinsic semiconducting material. The semiconductor material is provided to absorb the optical waves of the optical signal thereby creating an electron-hole pair which are than respectively accelerated to the respective doped regions under influence of the electric field.

According to preferred embodiments of the current disclosure, the shape and position of the p-doped regions or n-doped regions of the PIN junction avalanche diode are implemented in such a way to locally increase the internal electric field generated by an external reverse bias applied to the diode electrodes. By implementing the n-doped and/or p-doped region of the PIN junction avalanche diode as an array of respectively n-doped and/or p-doped regions, it has been found that the electric field is enhanced compared to an implementation with only one p-type region and only one n-type region as shown in FIG. 1. In addition, alternating p-type and n-type regions further helps to improve the electrical field. Further, it is found that the electric field improvement is increased by reducing the size of the individual contacts and individual doped regions in the array, as well as by reducing the width of the intrinsic region in between the doped regions.

According to preferred embodiments of the current disclosure, the doped regions of the array of p-doped regions or n-doped regions are less, preferably substantially less, than 0.1 micron wide. Such dimensioned doped regions have been found to generate a sufficiently large electric field in their vicinity to allow avalanche electrons to be created without having to use relatively large voltages.

According to preferred embodiments of the current disclosure, the at least one avalanche photodiode has a multiplication factor of more than one, preferably substantially greater than two, which has been found sufficient for the working of the avalanche photodetector element according to the disclosure.

According to preferred embodiments of the current disclosure, the photodetector region comprises at least an array of p-doped regions and an array of n-doped regions forming a resulting array of alternating p-doped regions and n-doped regions. It has been found that by employing a resulting array of alternating p-doped regions and n-doped regions the strength of the electric field can be further increased as both the dimensions of the p-doped region as the n-doped regions are now reduced.

According to preferred embodiments of the current disclosure, the resulting array has at least one row and at least one column which are made up from p-doped regions and n-doped regions alternating each other. Such configuration of the different doped regions, in all directions of the array (column and row direction), have been found to even further increase the volume of material which is susceptible to creation of optically excited electrons as some opposingly doped regions forming PIN-junction avalanche photodiodes are positioned adjacently along at least two sides of the doped regions and possible even along four sides of the doped regions when both the rows and the columns are provided with alternating p-doped regions and n-doped regions.

According to preferred embodiments of the current disclosure, adjacent doped regions are delimited from each other with a delimiting distance of 0.05 micron-0.5 micron, preferably 0.1 micron-0.2 micron. Such distances have been found to provide further improved avalanche photodetector elements.

According to preferred embodiments of the current disclosure, the intrinsic semiconducting material comprises Germanium, Silicon-Germanium, Germanium-Tin. It has been found that Germanium and Silicon-Germanium have good absorbing optical properties with optical waves having a wavelength of less than 1.6 micron. As such optical waves are often used for optical communication, for example over fiberglass communication lines, it has been found that such avalanche photodetectors can be used in optical communication applications. Germanium-Tin has been found to present improved absorption for wavelengths above 1.6 micron.

According to preferred embodiments of the current disclosure, the input waveguide comprises Silicon, preferably substantially Silicon, most preferable is made from Silicon, as silicon has does not substantially absorb optical waves having a wavelength in the range 1.2-3 micron, preferably 1.3 micron-1.6 micron which are often used in optical communications.

According to preferred embodiments of the current disclosure, the doped regions are provided with electrodes for interconnecting the avalanche photodetector in an electrical circuit.

The disclosure also relates to an electrical circuit comprising the avalanche photodetector element according to the disclosure, wherein the avalanche photodetector element is operated with a reverse bias potential difference is applied over the p-doped region and the n-doped region forming the PIN-junction avalanche photodiode. The electrical circuit can for example be incorporated on a chip.

The disclosure also relates to a method for making the avalanche photodetector according to the disclosure.

The doped regions can for example be made by ion-implantation, preferably followed by annealing or selective epitaxy.

The disclosure also relates to the use of the avalanche photodetector according to the disclosure for converting an optical signal to an electrical signal. Such use is for example especially preferred in optical communication applications.

According to preferred embodiments of the current disclosure, the optical signal comprises optical waves that have a wavelength of 1.3 micron-1.6 micron, preferably 1.53 micron-1.56 micron, as such wavelengths are often used in optical communications applications, as discussed above.

According to preferred embodiments of the current disclosure, a reverse bias potential difference is applied over the p-doped region and the n-doped region forming the PIN-junction avalanche photodiode.

According to preferred embodiments of the current disclosure, the reverse bias potential difference is about 1V-10V, preferably 2V-4V as such reverse bias potential differences have been found to be quite available in for example chip applications whereas nevertheless being sufficiently high to create avalanche electrons. Good results are expected at for example 2V.

According to preferred embodiments of the current disclosure, the reverse bias is applied to the preferred electrodes discussed above.

BRIEF DESCRIPTION OF THE DRAWINGS

All drawings are intended to illustrate some aspects and examples of the present disclosure. The drawings described are only schematic and are non-limiting, and are not necessarily drawn to scale.

FIG. 11b shows a cross section of a side view of the avalanche photodetector element according to FIG. 11a.

FIG. 11c shows a top view of the avalanche photodetector element according to FIG. 11a.

FIG. 11d shows a top view of a different embodiment of the avalanche photodetector element according to FIG. 11a.

DETAILED DESCRIPTION

Figure 1:
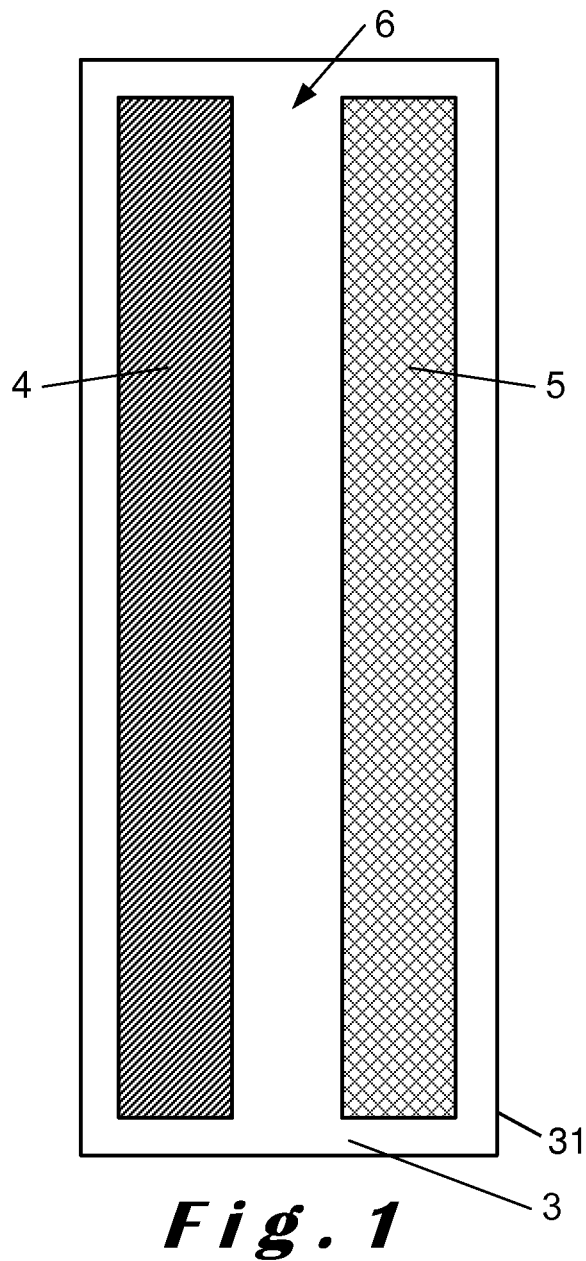
FIG. 1 shows a top view of an avalanche photodetector according to the prior art.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Figure 2:
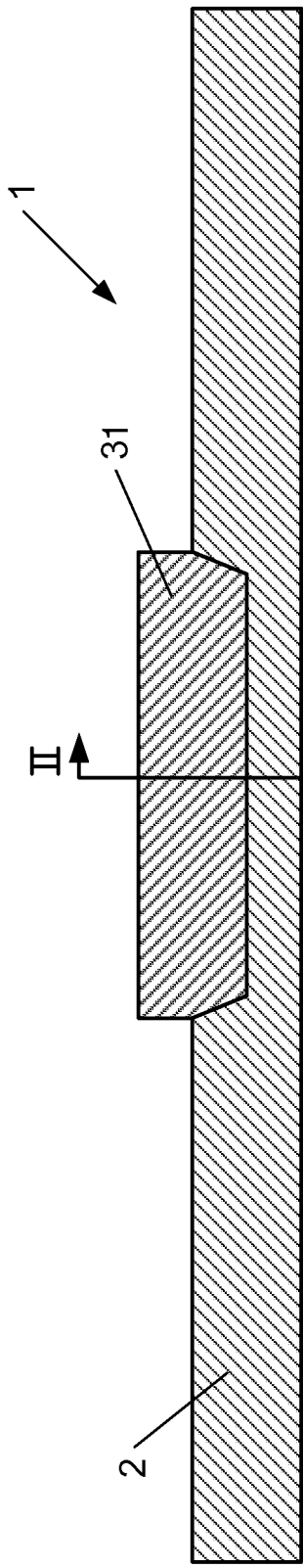
FIG. 2 shows a cross section of a side view of an avalanche photodetector element according to the present disclosure.

FIG. 2 shows a cross section of a side view of an avalanche photodetector element 1 for converting an optical signal to an electrical signal according to the present disclosure.

The avalanche photodetector element 1 comprises an input waveguide 2 and a photodetector region 31. The photodetector region 31 comprises at least one intrinsic region 3, at least one p-doped region 4 and at least one n-doped region 5. Although the doped regions 4, 5 are not shown in FIG. 2, the doped regions 4, 5 are for example shown in FIG. 3. The doped regions 4, 5 and the intrinsic region 3 form at least one PIN-junction avalanche photodiode 6.

The input waveguide 2 and the photodetector region 31 are arranged with respect to each other such that optical signal conducted by the input waveguide 2 is substantially conducted into the photodetector region 31 to the PIN-junction avalanche photodiode 6. The PIN-junction avalanche photodiode 6 converts the optical signal to an electrical signal.

The precise configuration, such as for example dimensions, shape, etc., of the input waveguide 2 and the intrinsic region 3, keeping their above-described functionality in mind, is not essential for the disclosure and can be further determined by the person skilled in the art depending on for example the characteristics, such as for example wavelength, intensity, etc., of the optical waves used, the intrinsic region 3, the material of the waveguide 2, etc.

Although not shown in the figures, the disclosure also relates to an electrical circuit comprising the avalanche photodetector element 1 according to the disclosure. In an electrical circuit, in operation, a reverse bias potential difference is applied over the p-doped region 4 and the n-doped region 5 forming the PIN-junction avalanche photodiode 6.

Figure 3:
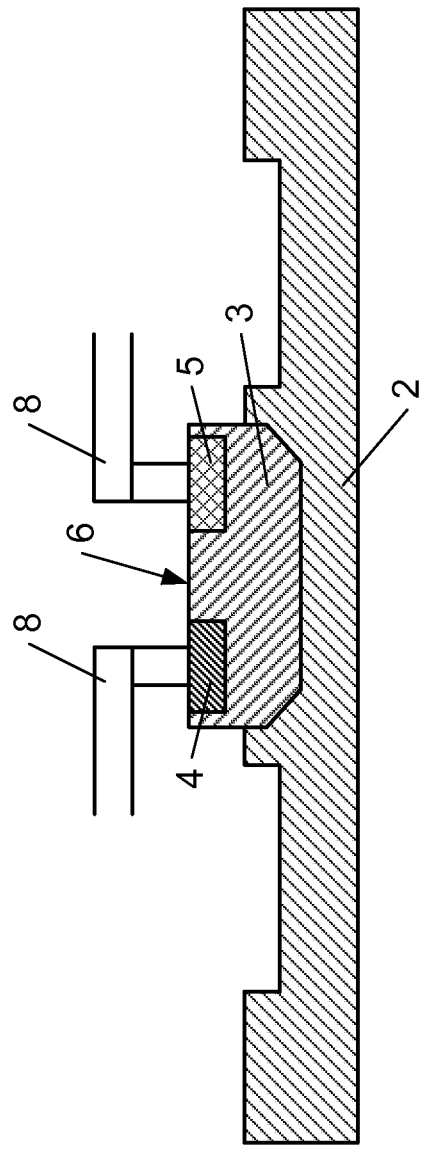
FIG. 3 shows a cross section of a frontal view of the avalanche photodetector element according to FIG. 2.

Although not shown in FIGS. 2 and 3, the photodetector region 31 comprises more than one p-doped region (4) and/or n-doped region (5), whereby these p-doped regions (4) and/or n-doped regions (5) of the photodetector region are physically arranged as an array. Different possibilities of arrays of the doped regions 4, 5 are, for example, shown in FIGS. 4-10.

Figure 4:
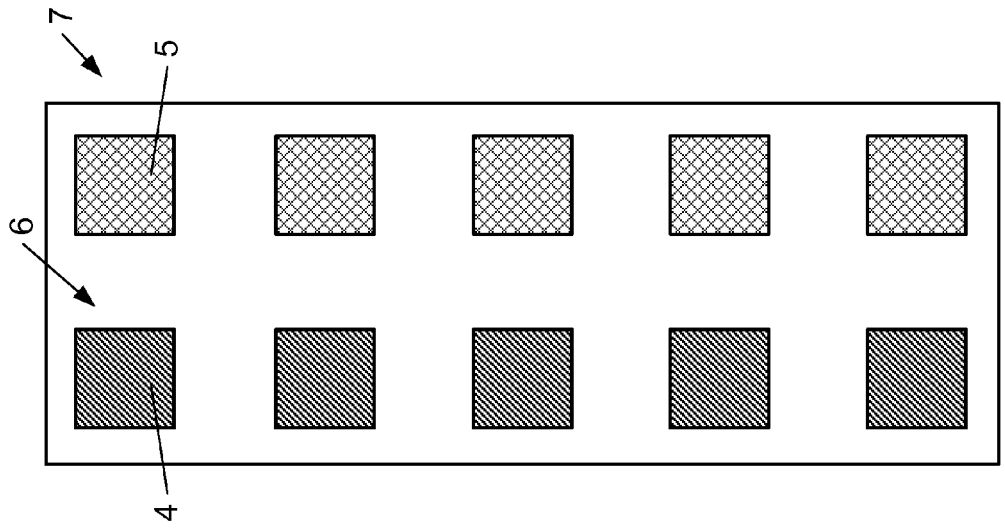
FIG. 4 shows a top view of a first embodiment of part of the avalanche photodetector element according to the disclosure.

FIG. 4 shows a top view of a first embodiment of part of the avalanche photodetector element 1 according to the disclosure.

According to FIG. 4, the avalanche photodetector element 1 comprises an array of n-doped regions 5. However, this is not critical for the disclosure and as shown in FIG. 5, the avalanche photodetector element 1 can also comprise an array of p-doped regions 4.

The array of doped regions 4, 5 comprises at least two doped regions, but preferably more than two such as for example three, four, five, six, seven, eight, nine, ten, eleven, twelve, thirteen, fourteen, fifteen, twenty, twenty-five, thirty, thirty-five, forty, etc. Preferably, the number of doped regions is determined as a function of, for example, the distance in between the doped regions 4, 5 along propagation direction of the optical wave and the length of the photodetector region 31 along that propagation direction. In general, the length of the photodetector region 31 along that propagation direction is in the range 5-100 micron.

Figure 5:
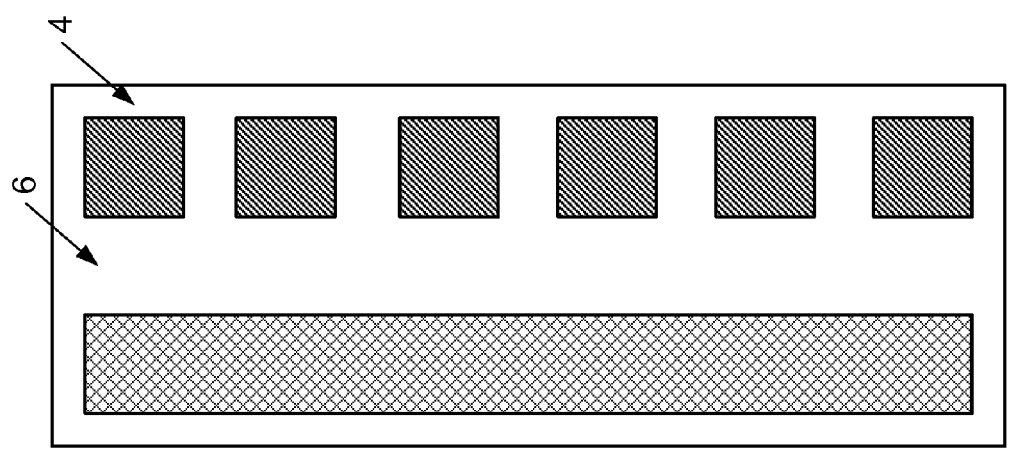
FIG. 5 shows a top view of an alternative embodiment of FIG. 4.

As can be seen in FIGS. 4 and 5, the doped regions 4, 5 of the array of p-doped regions 4 or n-doped regions 5 are delimited from each other by at least one intrinsic region 3. The intrinsic region is undoped.

In FIGS. 4 and 5, the array of doped regions 4, 5 is in the form of a linear array, having only a single column. Such configuration is however not critical for the disclosure, and other configurations are also possible such as for example an array having two or more columns.

Figure 6:
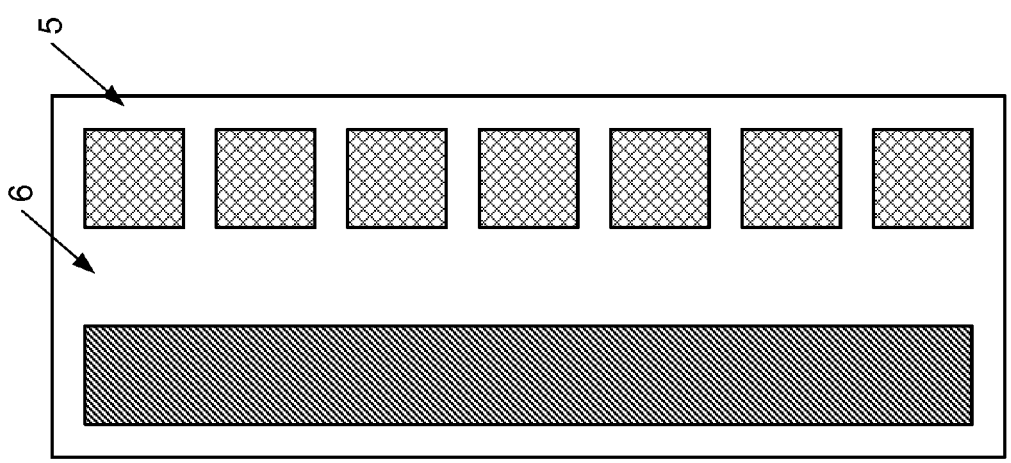
FIG. 6 shows a top view of an alternative embodiment of FIG. 4.
Figure 9:
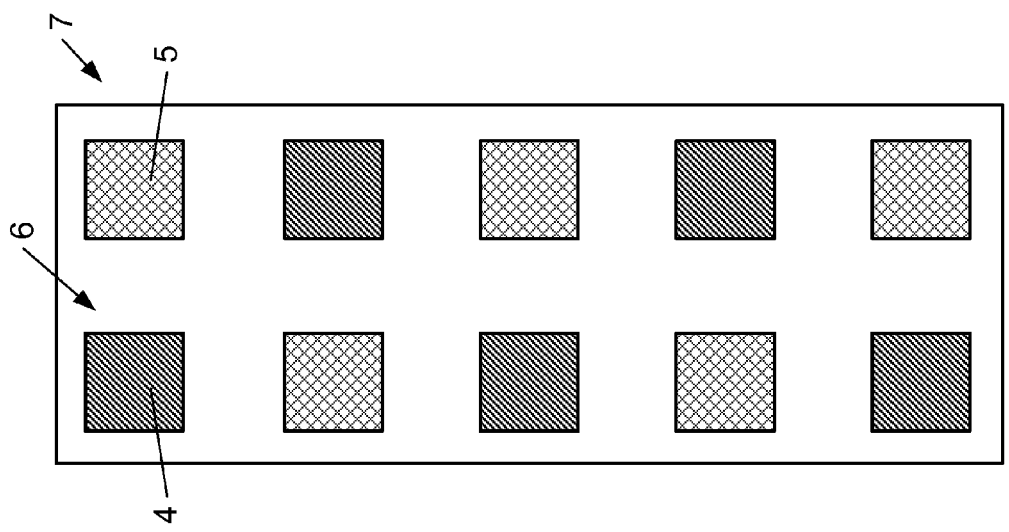
FIG. 9 shows a top view of an alternative embodiment of FIG. 4.

In FIGS. 4 and 5, the respective p-doped region and n-doped region opposing the respective array of n-doped regions 5 or p-doped regions 4 is in the form of a single uninterrupted doped region. FIG. 6 shows a further preferred embodiment wherein the single uninterrupted doped region is also replaced by an array of doped regions. The arrays of n-doped regions and p-doped regions 4, 5 form a resulting array of doped regions 7.

According to FIG. 6, the resulting array of doped regions 7 comprises two arrays of doped regions 4, 5, one n-doped region 5 and one p-doped region 4. This is however not critical for the disclosure and the resulting array of doped regions 7 can also comprise three, four, five, six, seven, eight, nine, ten, eleven, twelve, thirteen, fourteen, fifteen, twenty, twenty-five, thirty, thirty-five, forty, etc. arrays of doped regions 4, 5 depending on the desired application. The number of p-doped regions 4 and the number of n-doped regions also do not need to be the same.

Figure 7:
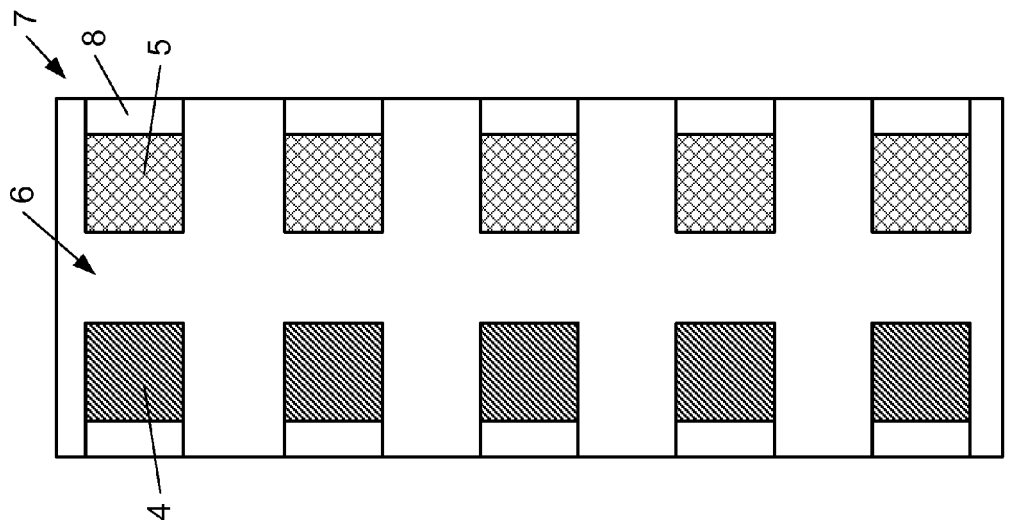
FIG. 7 shows a top view of an alternative embodiment of FIG. 4.

Although the rows of the resulting array 7 shown in FIG. 6 are made up from alternating p-doped regions 4 and n-doped regions 5, such configuration is not critical for the disclosure. FIG. 7, for example, shows the columns of the resulting array 7 are made up from alternating p-doped regions 4 and n-doped regions 5. Although not shown in the figures, it is also possible that only the columns of the resulting array 7 are made up from alternating p-doped regions 4 and n-doped regions 5.

Figure 8:
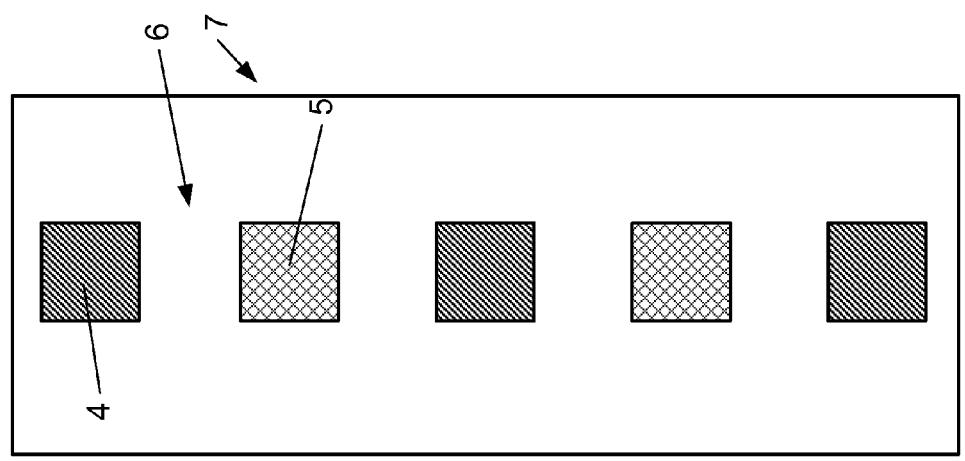
FIG. 8 shows a top view of an alternative embodiment of FIG. 4.

Although in FIGS. 6 and 7, the number of columns of the resulting array equals the number of arrays of doped regions 4, 5, such configuration is not critical for the disclosure as can, for example, be seen in FIG. 8 in which the resulting array 7 comprises a single column although comprising multiple arrays comprising either n-doped regions 5 or p-doped regions 4. The configuration of the resulting array 7 in other words does not depend on the number of arrays of comprising either n-doped regions 5 or p-doped regions 4, and can be determined by the person skilled in the art depending on the desired characteristics of the avalanche photodetector 1.

Figure 10:
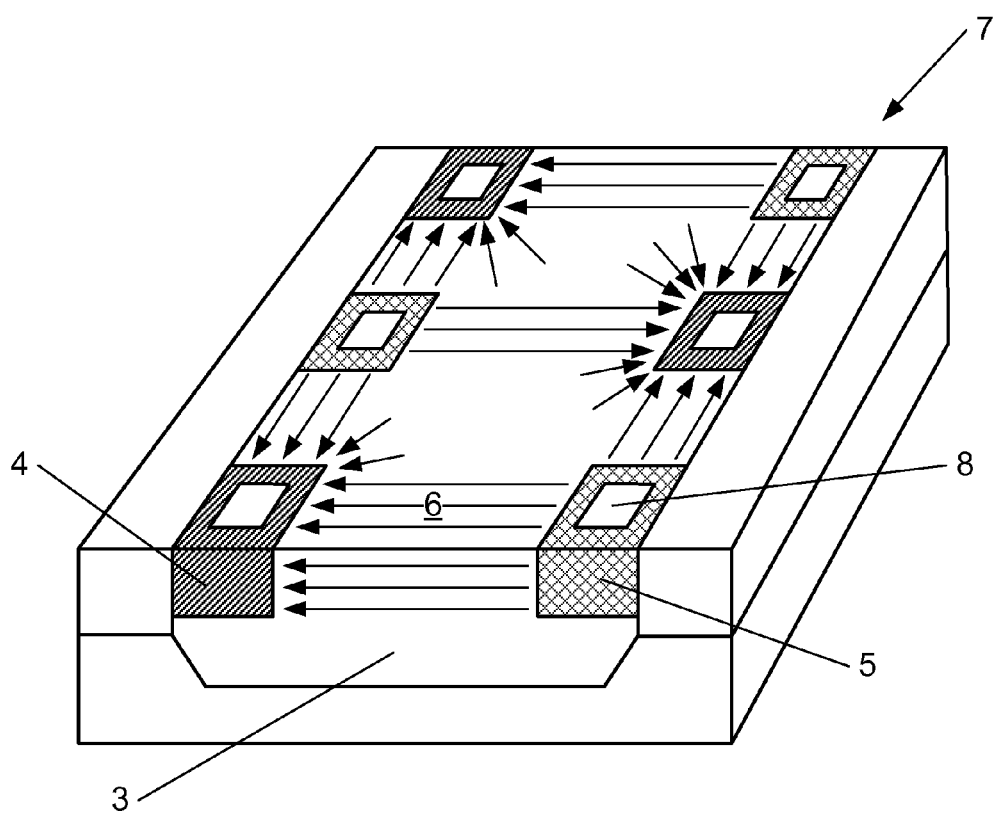
FIG. 10 shows a view in perspective of the embodiment shown in FIG. 7.

FIG. 10 shows a view in perspective of the embodiment shown in FIG. 7. In addition electric field lines between the p-doped regions 4 and the n-doped regions 5 are shown to illustrate the increase in PIN-junction avalanche photodiodes with respect to the prior art.

Also shown in FIG. 10 is the presence of electrodes 8 in and/or on the doped regions 4, 5 for interconnecting the avalanche photodetector 1 inside or to an electrical circuit. The electrodes 8 have not been shown for clarity purposes in FIG. 4-8. Although FIG. 10 shows that the electrodes 8 are applied on and/or in the doped regions 4, 5, this is not critical for the disclosure, and the electrodes 8 can also be applied next to the doped regions 4, 5. This is, for example, shown in FIG. 9, where the electrodes 8 are applied next to the doped regions. Although in such configuration the interference of the metal in the doped region where it is applied is lower as absorption of light in the doped regions is prevented, the capacitance of the diodes has been found to increase.

Figure 11A:
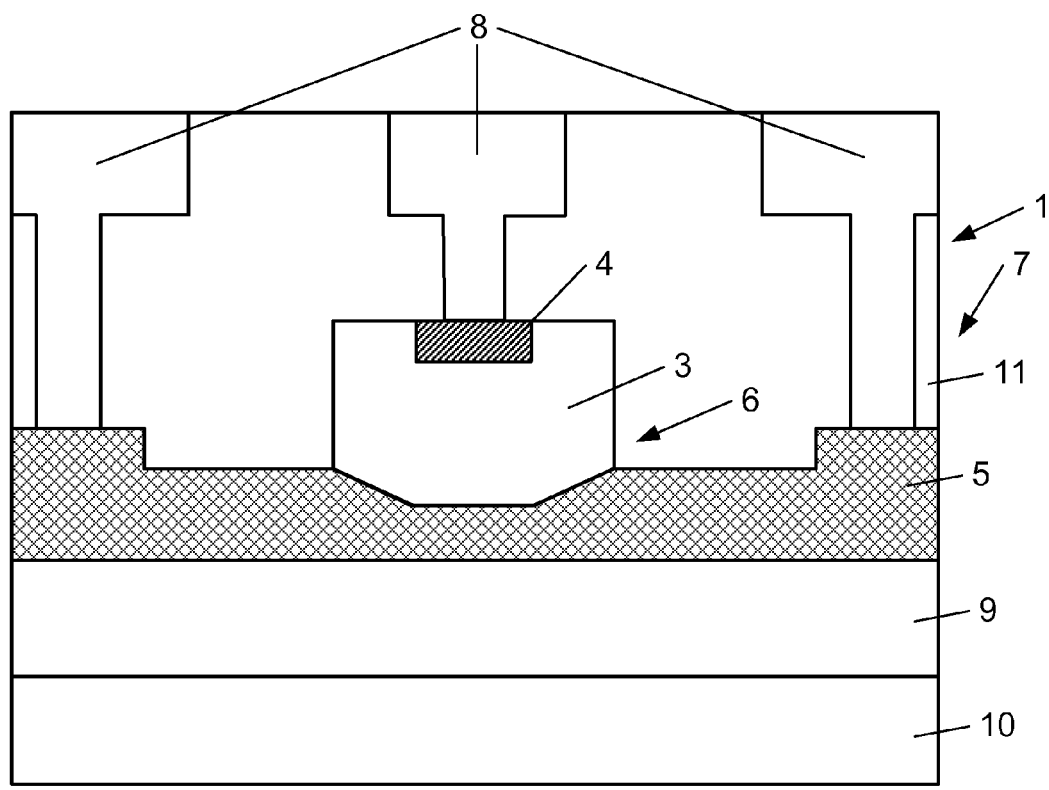
FIG. 11a shows a cross section of a frontal view of the avalanche photodetector element according to a different embodiment of the present disclosure.
Figure 11B:
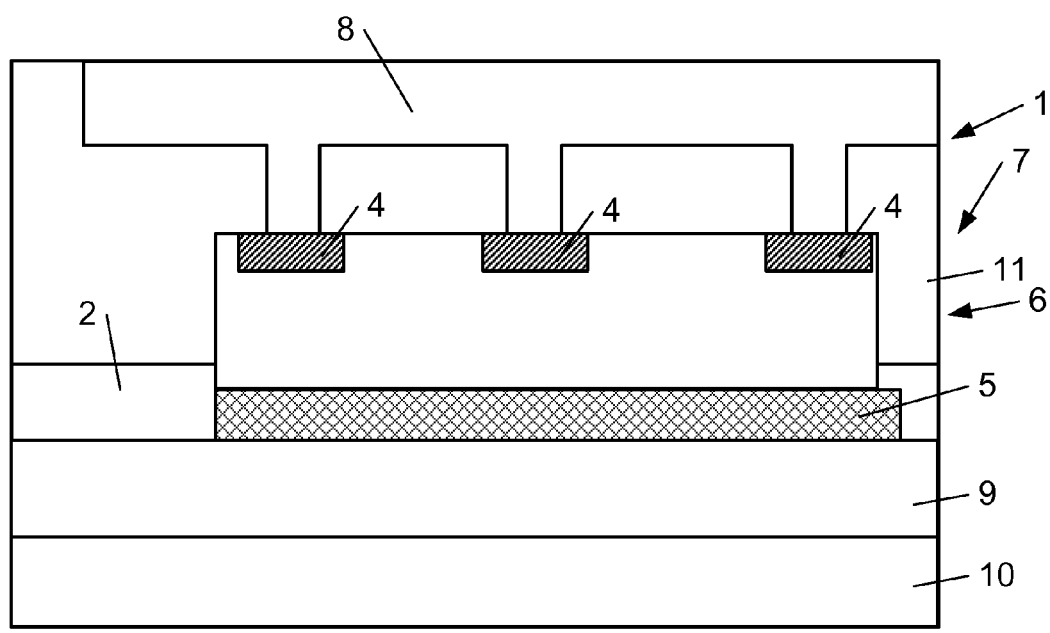
Figure 11C:
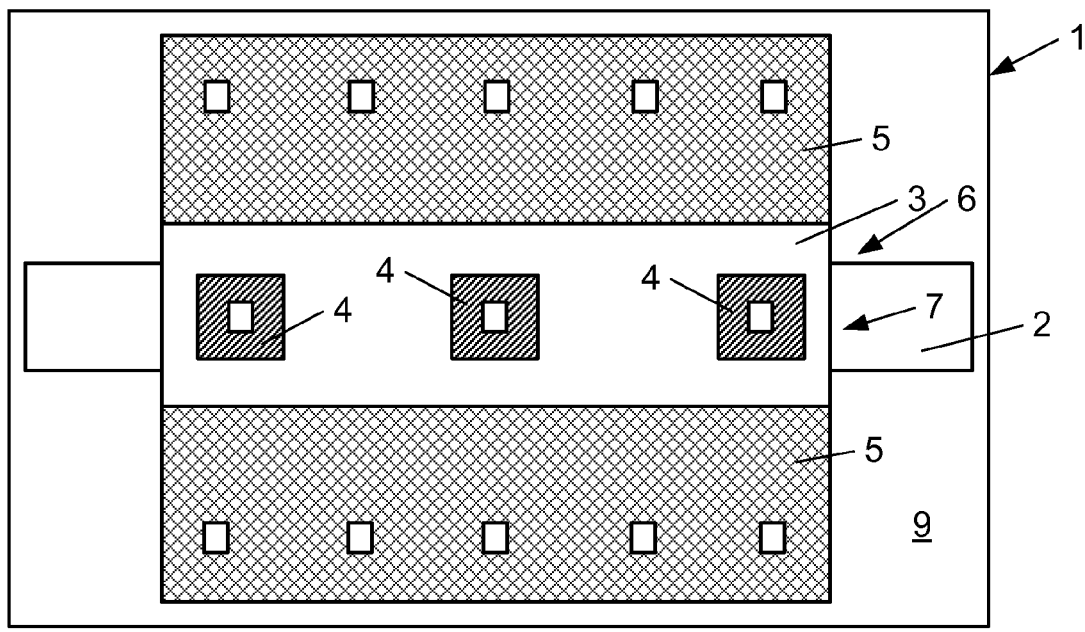
Figure 11D:
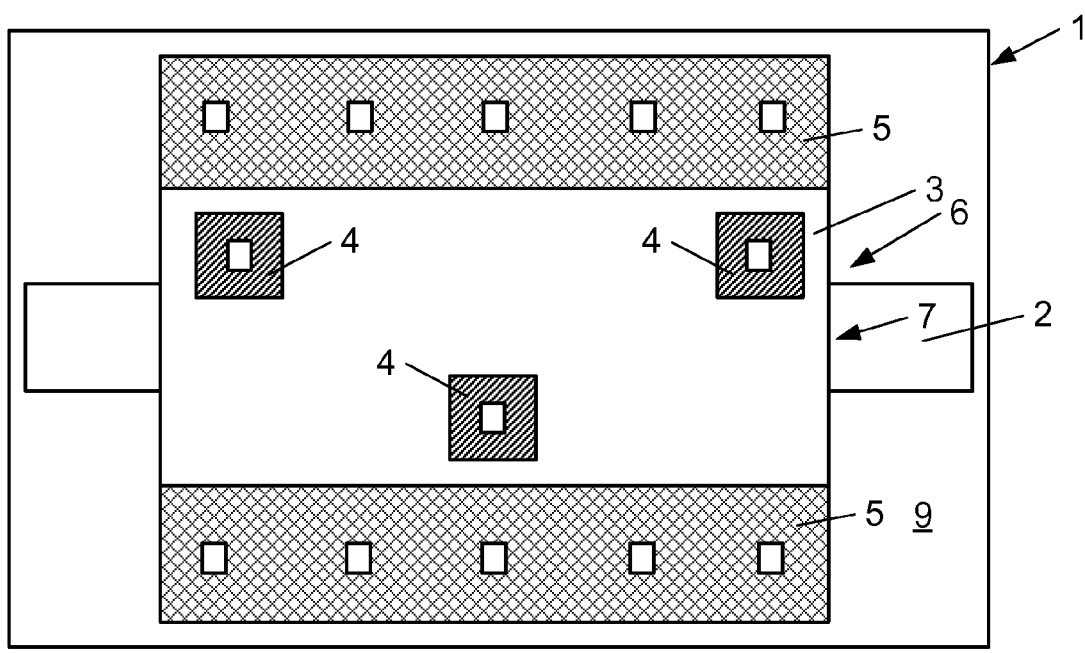

Although the doped regions may be positioned substantially in a single plane, as is possible in the configurations shown in FIGS. 2-10, the doped regions can also be provided in different planes, forming a more three-dimensional configuration as shown in the embodiment shown in different views in FIGS. 11a-11c, and the alternative embodiment in FIG. 11d.

FIG. 11a shows that for example on top of substrate 9 of, for example, Silicon dioxide, for example on its turn on top of a layer 10 of Silicon, an n-doped region 5 is provided. As shown, preferably several electrodes 8 are provided contacting the n-doped region 5.

On top of the n-doped region 5 the intrinsic region 3, for example Germanium, is provided. On the upper side of the intrinsic region 3, an array of p-doped regions 4 is provided. In their turn, the p-doped regions 4, for example p+ doped regions, are connected to electrodes 8. The space in between the different components is filled up with filling material 11, for example $SiO_2$.

The n-doped region 5 for example is made from Silicon material, the parts of the region 5 in close proximity with the electrodes 8 are highly doped (n++), whereas the parts of the doped region 5 further away from the electrodes 8 are less doped (n+). The doped region 5 could however also be homogenously highly or more lowly doped, as depends from the desired applications.

Of course the p-doped regions can be interchanged with the n-doped regions, as deemed appropriate in light of the desired applications of the photodetector element 1.

FIG. 11b shows the different p-doped regions 4 with respect to the underlying n-doped region 5 in more detail. Further, the relation between the input waveguide 2 and the intrinsic region 3 is shown, allowing the optical signals to enter the intrinsic region 3 where the optical signals can generate electron-hole pairs which can then subsequently be respectively accelerated towards the respective doped regions 4, 5. FIG. 11c shows a top view of the avalanche photodetector element 1 according to FIG. 11a. It can be observed that the different p-doped regions are provided above and along the input waveguide 2. As shown in FIG. 11c, the p-doped regions 4 are collinear. However, as shown in FIG. 11d, such configuration is not critical and the different p-doped regions 4 can also be provided on, for example, different lines, for example parallel lines.

While particular aspects and examples are disclosed herein, other aspects and examples will be apparent to those skilled in the art in view of the foregoing teaching. While the examples are described with respect to applications for remote-controlled vehicles, the disclosed systems and methods are not so limited. The various aspects and examples disclosed herein are for illustration purposes only and are not intended to be limiting, with the true scope and spirit being indicated by the following claims.

The invention claimed is:

1. An avalanche photodetector element for converting an optical signal to an electrical signal comprising:
   an input waveguide; and
   a photodetector region that includes at least one intrinsic region, at least one p-doped region, and at least one n-doped region, and wherein the at least one intrinsic region comprises a semiconducting material configured to absorb optical waves of the optical signal;
   wherein the at least one intrinsic region, the at least one p-doped region, and the at least one n-doped region form at least one PIN-junction avalanche photodiode;
   wherein the PIN-junction avalanche photodiode is configured to convert the optical signal to an electrical signal;
   wherein the at least one p-doped region and the at least one n-doped region are physically arranged as an array; and
   wherein the input waveguide and the photodetector region are arranged with respect to each other such that the optical signal conducted by the input waveguide is substantially conducted into the photodetector region to the PIN-junction avalanche photodiode.

2. The avalanche photodetector element of claim 1, wherein the at least one p-doped region and the at least one n-doped region in the array are delimited from each other by the at least one intrinsic region.

3. The avalanche photodetector element of claim 1, wherein the at least one p-doped region and the at least one n-doped region are substantially less than 0.1 microns wide.

4. The avalanche photodetector element of claim 1, wherein the at least one PIN-junction avalanche photodiode has a multiplication factor of more than one.

5. The avalanche photodetector element of claim 1, wherein the photodetector region further comprises:
   at least one array of p-doped regions;
   at least one array of n-doped regions; and
   wherein the at least one array of p-doped regions and the at least one array of n-doped regions form an array of alternating p-doped regions and n-doped regions.

6. The avalanche photodetector element of claim 5, wherein the array of alternating p-doped regions and n-doped regions has at least one row and at least one column made up from alternating p-doped regions and n-doped regions.

7. The avalanche photodetector element of claim 1, wherein the at least one p-doped region and the at least one n-doped region are delimited from each other with a delimiting distance of substantially 0.05 microns-0.5 microns.

8. The avalanche photodetector element of claim 1, further comprising electrodes for connecting the avalanche photodetector element to an electrical circuit.

9. The avalanche photodetector element of claim 1, wherein the optical signal comprises optical waves, wherein the optical waves have a wavelength of substantially 1.3 microns-1.6 microns.

\* \* \* \* \*